(12) United States Patent
Nimura

(10) Patent No.: US 6,933,795 B2
(45) Date of Patent: Aug. 23, 2005

(54) OSCILLATING CIRCUIT AND A SEMICONDUCTOR INTEGRATED CIRCUIT

(75) Inventor: Yoshihiko Nimura, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/454,787

(22) Filed: Jun. 3, 2003

(65) Prior Publication Data

US 2004/0021521 A1 Feb. 5, 2004

(30) Foreign Application Priority Data

Jun. 12, 2002 (JP) ........................................ 2002-170890

(51) Int. Cl.[7] ................................................. H03B 5/32
(52) U.S. Cl. ............... 331/158; 331/116 R; 331/116 FE
(58) Field of Search ........................... 331/158, 116 R, 331/116 FE

(56) References Cited

U.S. PATENT DOCUMENTS 4,321,562 A * 3/1982 Igarashi ................ 331/116 FE
6,798,306 B2 * 9/2004 Kurosawa ................... 331/158

FOREIGN PATENT DOCUMENTS

JP          06-006135         1/1994

* cited by examiner

*Primary Examiner*—Arnold Kinkead
(74) *Attorney, Agent, or Firm*—Hogan & Hartson, LLP

(57) ABSTRACT

An oscillating circuit includes an oscillating element having a first terminal and a second terminal, a plurality of inverting amplifiers connected in series between the first terminal and the second terminal of the oscillating element, and an impedance element connected between an input terminal and an output terminal of a predetermined inverting amplifier among the plurality of inverting amplifiers.

13 Claims, 4 Drawing Sheets

PRIOR ART

PRIOR ART

OSCILLATING CIRCUIT AND A SEMICONDUCTOR INTEGRATED CIRCUIT

BACKGROUND OF THE INVENTION

Field of the Invention

The present invention relates to an oscillating circuit using, for example, a quartz crystal resonator, a Surface Acoustic Wave (SAW) resonator, or a ceramic resonator. Moreover, the present invention relates to a semiconductor integrated circuit having such an oscillating circuit.

Demand for faster operating speeds in computers and other electronic equipment increases each year. Electronic equipment controls the timing of operations in circuits in all parts, using a clock signal generated by an internal oscillating circuit. Therefore, in order to increase the operating speed of such electronic equipment, it is necessary to raise the oscillating frequency in oscillating circuits. On the other hand, when the oscillating frequency is raised, power consumption and heat generation tend to increase. Hence, designers seek to minimize the power consumption of oscillating circuits.

Oscillating circuits require high frequency stability. A crystal oscillator having a crystal resonator is the most commonly used type of oscillating circuit. Crystal resonators exhibit a property wherein the thinner the crystal, the higher its oscillation frequency. However, the thinner the crystal, the more difficult is its industrial mass production.

Therefore, rather than use the fundamental mode of a quartz crystal, oscillating circuits that operate on an odd overtone of the fundamental mode are used. This type of oscillating circuit is called an overtone oscillating circuit.

A 3rd overtone oscillating circuit wherein oscillation in an overtone mode is enabled by lowering the feedback resistor of an oscillating circuit is shown in FIG. 5. In this oscillating circuit a crystal resonator 50, an inverter 53, and a feedback resistor 54 are connected in parallel, and capacitors 51, 52 are connected respectively between junctions and ground potential.

According to FIG. 5, if the resistance value of the feedback resistor 54 is set at or below a certain limit, the oscillating circuit will no longer be able to oscillate in the fundamental mode and will oscillate in the overtone mode. The resistance value of that limit is determined by the frequency of the fundamental wave of the crystal resonator 50 used, and the higher the fundamental wave, the smaller the resistance value of the limit at which that fundamental wave is no longer able to oscillate. For example, in the case of a crystal resonator having a fundamental wave frequency of about 10 MHz, the resistance value at which oscillation is no longer possible in the fundamental mode is approximately 30 kΩ.

Therefore, according to the oscillating circuit shown in FIG. 5, for example, to obtain an oscillating frequency of 36 MHz, the fundamental wave of the crystal resonator 50 is set to 12 MHz, the resistance value of the feedback resistor 54 is set to 30 kΩ or less, and oscillation in the 3rd overtone mode is achieved.

On the other hand, FIG. 6 discloses a 3rd overtone oscillating circuit in which the gain of an inverting amplifier is increased and oscillation startup performance is enhanced. In this oscillating circuit, an output of a first inverter 61 is connected to a gate of a second inverter 62, and an output of the second inverter 62 is connected to a gate of a third inverter 63. Moreover, an inverting amplifier is formed by connecting a feedback resistor 64 having a resistance value below a certain limit between an output of the third inverter 63 and a gate of the first inverter 61. This oscillating circuit is similar to that shown in FIG. 5 in that the oscillating circuit is formed by connecting this feedback resistor 64 and crystal resonator 50 in parallel and, connecting capacitors 51, 52 respectively between these junctions and ground potential.

According to FIG. 6, an ordinary AT-cut crystal resonator has a strong predisposition toward oscillating at the frequency of the fundamental wave, and it is difficult to achieve oscillation in the 3rd overtone mode simply by shrinking the resistance value of the feedback resistor as described above. Hence and it is therefore necessary to increase the driving force of the inverting amplifier and to enhance the oscillation startup. However, if an inverter having a large driving force is used in order to enhance oscillation startup, the problem of increased current consumption occurs.

Therefore, in the oscillating circuit shown in FIG. 6, the input signal of inverter 61 is greatly amplified by inverters 61–63 so as to enable oscillation in the 3rd overtone mode, even if the driving force of the individual inverters is small. In addition, due to the waveform shaping effect of the inverter, the gate input waveform of the second inverter 62 and of the third inverter 63 become closer to rectangular waves. These make it possible to diminish the overall level of the oscillating circuit's current consumption.

However, according to the oscillating circuit shown in FIG. 6, the gain of an inverted amplifying circuit including inverters 61–63 is extremely large, so even very slight noise input to the inverter 61 is greatly amplified, making the oscillating circuit highly susceptible to the effects of noise.

Moreover, at high frequencies, the phase rotation of an inverted amplifying circuit including inverters 61–63 grows large, making the amplifying circuit susceptible to the adverse effects of temperature drifts and circuit element variations and resulting in unstable oscillation.

Therefore, taking the aforementioned problems into account, the present invention, of an oscillating circuit using an oscillating element such as a crystal resonator, is intended to diminish the effects of temperature drifts and circuit element variations and to enable stable oscillation at high frequencies while limiting current consumption.

SUMMARY OF THE INVENTION

To solve the aforementioned problems, an oscillating circuit of the present invention includes an oscillating element having a first terminal and a second terminal, a plurality of inverting amplifiers connected in series between the first terminal and the second terminal of the oscillating element, and an impedance element connected between an input terminal and an output terminal of a predetermined inverting amplifier among the plurality of inverting amplifiers.

Here, the oscillating circuit may further include a first capacitor connected between the oscillating element's first terminal and a reference voltage, and a second capacitor connected between the oscillating element's second terminal and the reference voltage.

Moreover, the oscillating circuit may include resistors provided between the input terminal and the output terminal of all of the plurality of inverting amplifiers. The oscillating circuit may also include resistors connected between the input terminal and the output terminal of all of the plurality of inverting amplifiers except a final stage. These resistors preferably have a progressively larger resistance value from a former stage to a latter stage. Moreover, the value of an absolute open loop gain of the inverting amplifiers connected in series is preferably progressively larger from a former stage to a latter stage.

In the aforementioned oscillating circuit a crystal resonator, a surface acoustic wave resonator, or a ceramic resonator may be used as the oscillating element. In addition, an inverter may be used as the inverting amplifier. Moreover, a semiconductor integrated circuit of the present invention includes any of the aforementioned oscillating circuits.

According to the present invention, connecting an impedance element between an input terminal and an output terminal of a predetermined inverting amplifier among the plurality of inverting amplifiers suppresses the effects of noise. Moreover, as a value of the phase rotation of the inverted amplifying circuit to the resonator is applied appropriately to the oscillator, this also diminishes the effects of temperature drifts and circuit element variations and enables stable oscillation at high frequencies while limiting current consumption.

DETAILED DESCRIPTION OF THE PREFERRED EMBODIMENTS

Figure 1:
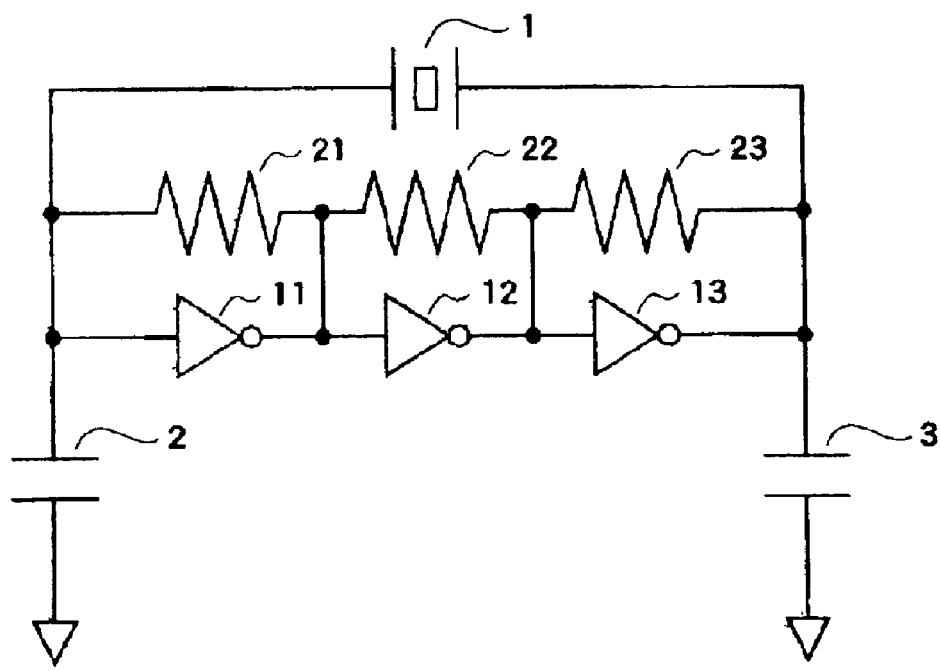
FIG. 1 shows an oscillating circuit of a preferred embodiment of the present invention.

A preferred embodiment of the present invention is described with reference to figures. FIG. 1 shows an oscillating circuit of a preferred embodiment of the present invention.

As shown in FIG. 1, an oscillating circuit of a preferred embodiment of the present invention includes an oscillating element 1 (a crystal resonator in the present embodiment) having a first terminal and a second terminal; a plurality of inverting amplifiers (inverters in the present embodiment) 11–13 connected in series between the first terminal and the second terminal of the crystal resonator 1; and impedance elements 21–23 (feedback resistors in the present embodiment) connected between the input terminal and the output terminal of each of the inverters 11–13. Furthermore, the oscillating circuit includes a capacitor 2 connected between the first terminal of the crystal resonator and the reference voltage (the ground potential in the present embodiment); and a capacitor 3 connected between the second terminal of the crystal resonator and the ground potential.

Here, if the resistance value of each of the feedback resistors 21, 22, 23 is expressed as $Rf_1$, $Rf_2$, and $Rf_3$, respectively, then a relationship where $Rf_1 \leq Rf_2 \leq Rf_3$ is preferable. In particular, establishing a relationship where $Rf_1 < Rf_2 < Rf_3$ enables the gain (absolute value) of the inverters 11–13 to be progressively increased from a former stage to a latter stage. If the gain of the inverter 13 in the last stage is increased, the negative resistance in an equivalent circuit of the oscillating circuit can be increased, so energy efficiency is improved. For this reason, depending on the circuit conditions, a feedback resistor may not be connected to the inverter 13 of the final stage.

In addition, if the open loop gain of each of the inverters 11, 12, 13 is expressed as $A_1$, $A_2$, and $A_3$, respectively, then a relationship where $A_1 \leq A_2 \leq A_3$ is preferable. In particular, by establishing a relationship where $A_1 < A_2 < A_3$, where the resistance values of the feedback resistors 21, 22, 23 is $Rf_1 < Rf_2 < Rf_3$, the feedback level of the inverters can be made more nearly uniform.

Figure 2:
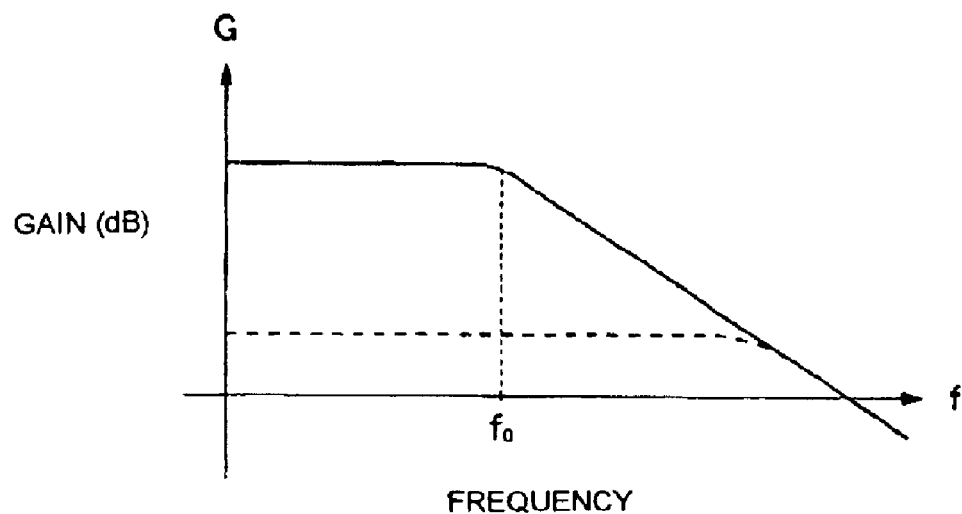
FIG. 2 is a graph that is used to describe changes in gain caused by a feedback resistor.
Figure 3:
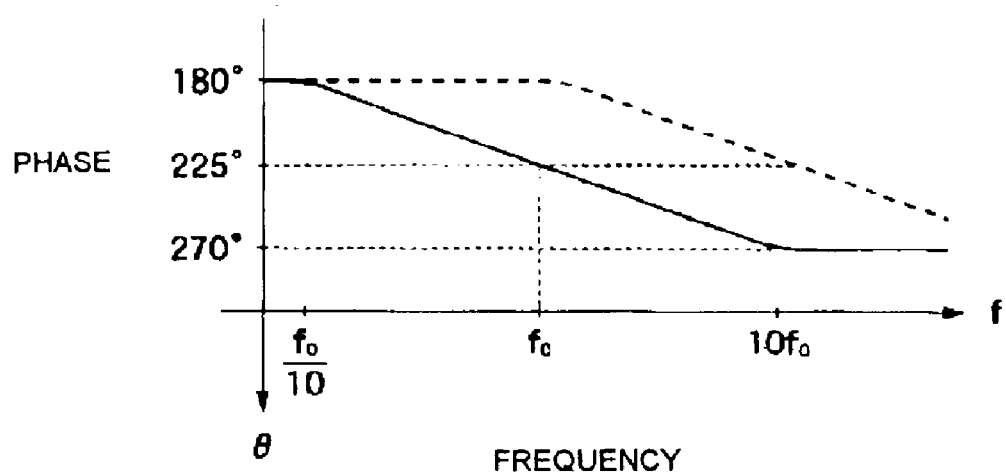
FIG. 3 is a graph that is used to describe changes in phase rotation caused by a feedback resistor.

FIG. 2 is a graph that is used to describe changes in gain caused by a feedback resistor. FIG. 3 is a graph that is used to describe changes in the phase rotation caused by a feedback resistor. In these figures, the horizontal axis, which represents frequency, is based on a logarithmic scale.

As indicated by the solid line in FIG. 2, when a feedback resistor is not connected to an inverter, in a frequency domain higher than the frequency $f_0$ determined by the inverter, the gain (absolute value) of the inverter decreases as the frequency increases. On the other hand, as indicated by the dashed line in FIG. 2, when a feedback resistor is connected to an inverter, the gain is suppressed overall, but the constant gain is extended, even in a frequency domain higher than $f_0$. Hence, the inverter gain can be easily set. Also, by not increasing the inverter gain more than necessary, the amplification of noise input to the inverter 11 is suppressed.

In addition, as indicated by the solid line in FIG. 3, when a feedback resistor is not connected to an inverter, the phase is delayed by substantially more than 180 degrees (inverted condition) in a frequency domain higher than about $f_0/10$. Conversely, as indicated by the dashed line in FIG. 3, when a feedback resistor is connected to an inverter, it is possible to achieve a phase rotation approaching 180 degrees, even in frequency domains higher than about $f_0/10$.

Therefore, the gain and phase rotation at each amplification stage are set by connecting each of the feedback resistors 21–23 to the inverters 11–13, respectively, as shown in FIG. 1. Specifically, the values of the feedback resistors 21–23 are set so that the loop gain of the oscillation loop in the oscillating frequency is 1 or greater, and the phase rotation of the inverters 11–13 is $(180+\alpha)°$. Here, if the phase rotation in the crystal resonator 1 and capacitors 2 & 3 is set in the vicinity of $(180-\alpha)°$, the phase rotation, which loops the oscillation loop back, approaches 360 degrees, and stable oscillation can be achieved.

Figure 4:
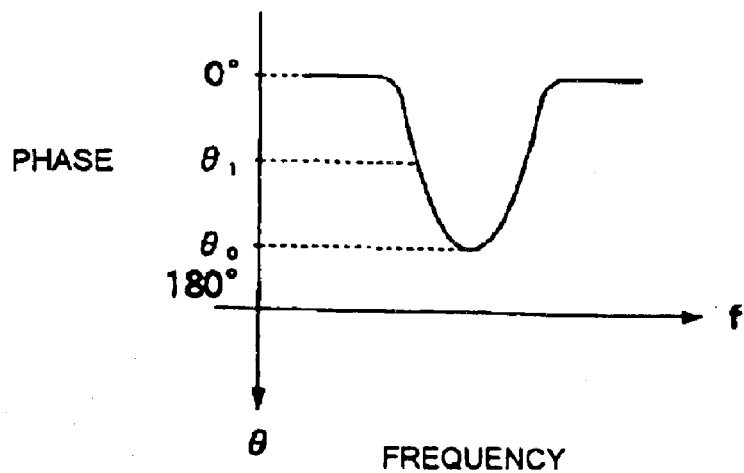
FIG. 4 is a graph that shows the relationship between a crystal resonator's phase rotation and its oscillating frequency.
Figure 5:
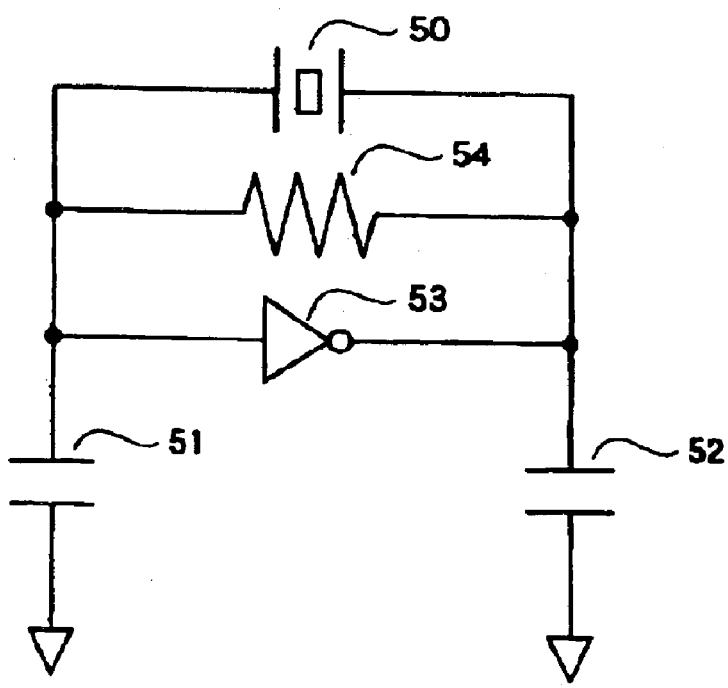
FIG. 5 is a circuit diagram showing the configuration of an oscillating circuit of the prior art.
Figure 6:
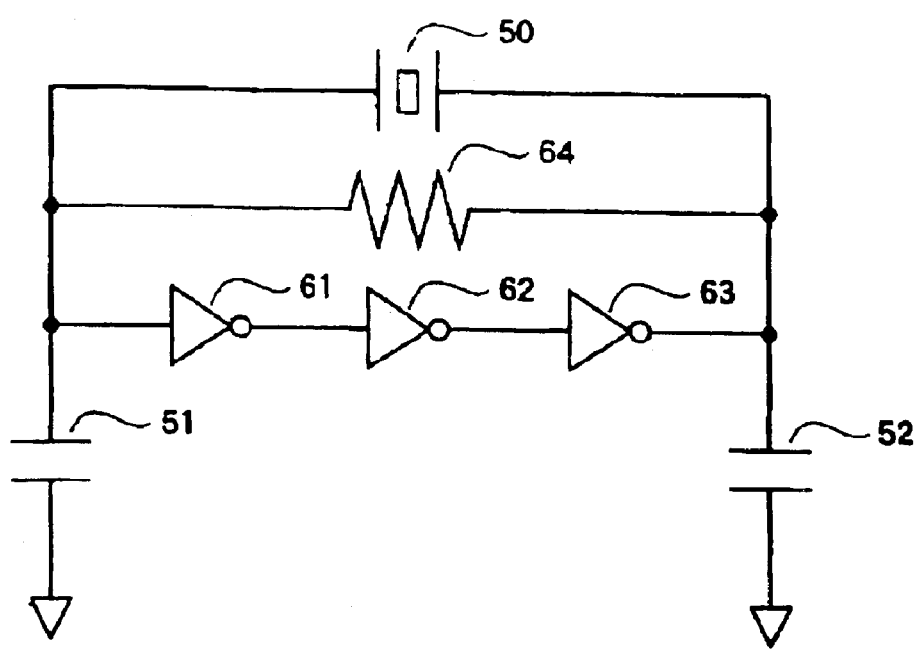
FIG. 6 is a circuit diagram showing the configuration of an oscillating circuit of the prior art.

FIG. 4 shows the relationship between the crystal resonator's phase rotation and oscillating frequency. When the maximum value of the phase rotation in the quartz crystal is $\theta_0$, if the oscillating circuit operates with the phase rotation of the crystal resonator in a state near $\theta_0$, the frequency changes greatly due to the small gradient of the phase with respect to the frequency, even if the phase changes slightly. Therefore, if the oscillating circuit operates with the phase rotation of the crystal resonator in the vicinity of $\theta_1$, that is, in a state smaller than $\theta_0$, frequency changes with respect to the same phase changes can be minimized due to a large gradient of the phase with respect to the frequency. The aforementioned angle $\alpha$ is thus determined. According to the present embodiment, the phase rotation in the inverters 11–13 can be matched with high precision so as to achieve a phase rotation in the crystal oscillator of $\theta_1$.

In the present embodiment, a case where the inverters have a three-stage configuration is described, but there may be any number of inverter stages as long as there is a plurality. However, if the number of inverters is an even number, the oscillation loop will stabilize in a direct current (DC)-like manner. Hence, attention needs to be paid to the startup, therefore.

As described above, according to the present invention, the effects of temperature drifts and circuit element variations in an oscillating circuit using an oscillating element such as a crystal resonator are diminished, and stable oscillation is achieved at high frequencies while limiting current consumption.

What is claimed is:

1. An oscillating circuit comprising:
   an oscillating element having a first terminal and a second terminal;
   a plurality of inverting amplifiers connected in series between the first terminal and the second terminal of the oscillating element; and
   a plurality of impedance elements connected in series between the first terminal and the second terminal of the oscillating element, wherein at least one impedance element is provided between an input terminal and an output terminal of each inverting amplifier among the plurality of inverting amplifiers, and
   wherein a resistor connected between the input terminal and the output terminal is provided for all of the plurality of inverting amplifiers except a final stage.

2. The oscillating circuit as claimed in claim 1 further comprising:
   a first capacitor connected between the first terminal of the oscillating element and a reference voltage; and
   a second capacitor connected between the second terminal of the oscillating element and the reference voltage.

3. An oscillating circuit comprising:
   an oscillating element having a first terminal and a second terminal;
   a plurality of inverting amplifiers connected in series between the first terminal and the second terminal of the oscillating element; and
   a plurality of impedance elements connected in series between the first terminal and the second terminal of the oscillating element, wherein at least one impedance element is provided between an input terminal and an output terminal of each inverting amplifier among the plurality of inverting amplifiers;
   wherein the plurality of impedance elements comprises a plurality of resistors that have progressively large resistance values from a former stage to a latter stage.

4. The oscillating circuit as claimed in claim 3, wherein a value of an absolute open loop gain of the plurality of inverting amplifiers connected in series is progressively larger in value from a former stage to a latter stage.

5. The oscillating circuit as claimed in claim 1, wherein the oscillating element is selected from the group consisting of a crystal resonator, a surface wave acoustic resonator, and a ceramic resonator.

6. The oscillating circuit as claimed in claim 1, wherein each of the plurality of inverting amplifiers is an inverter.

7. A semiconductor integrated circuit comprising an oscillating circuit as claimed in claim 1.

8. An oscillating circuit comprising:
   means for oscillating having a first terminal and a second terminal;
   a plurality of inverting amplifiers connected in series between the first terminal and the second terminal of the means for oscillating; and
   a plurality of impedance elements connected in series between the first terminal and the second terminal of the oscillating element, wherein at least one impedance element is provided between an input terminal and an output terminal of each inverting amplifier among the plurality of inverting amplifiers, and
   wherein a resistor connected between the input terminal and the output terminal is provided for all of the plurality of inverting amplifiers except a final stage.

9. The oscillating circuit as claimed in claim 8 further comprising:
   a first capacitor connected between the first terminal of the means for oscillating and a reference voltage; and
   a second capacitor connected between the second terminal of the means for oscillating and the reference voltage.

10. An oscillating circuit comprising:
    means for oscillating having a first terminal and a second terminal;
    a plurality of inverting amplifiers connected in series between the first terminal and the second terminal of the means for oscillating; and
    a plurality of impedance elements connected in series between the first terminal and the second terminal of the oscillating element, wherein at least one impedance element is provided between an input terminal and an output terminal of each inverting amplifier among the plurality of inverting amplifiers;
    wherein the plurality of impedance elements comprises a plurality of resistors that have progressively larger resistance values from a former stage to a latter stage.

11. The oscillating circuit as claimed in claim 10, wherein a value of an absolute open loop gain of the plurality of inverting amplifiers connected in series is progressively larger in value from a former stage to a latter stage.

12. The oscillating circuit as claimed in claim 8, wherein the means for oscillating is selected from the group consisting of a crystal resonator, a surface wave acoustic resonator, and a ceramic resonator.

13. The oscillating circuit as claimed in claim 8, wherein each of the plurality of inverting amplifiers is an inverter.

* * * * *